(12) United States Patent
Shin (10) Patent No.: US 11,055,089 B2
(45) Date of Patent: Jul. 6, 2021

(54) VEHICLE TERMINAL AND SOFTWARE UPDATE METHOD THEREOF

(71) Applicants: HYUNDAI MOTOR COMPANY, Seoul (KR); KIA MOTORS CORPORATION, Seoul (KR)

(72) Inventor: Yong Jin Shin, Yongin-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/868,036

(22) Filed: May 6, 2020

(65) Prior Publication Data

US 2021/0173635 A1 Jun. 10, 2021

(30) Foreign Application Priority Data

Dec. 6, 2019 (KR) .................. 10-2019-0161989

(51) Int. Cl.
| | |
|---|---|
| *G06F 9/44* | (2018.01) |
| *G06F 8/658* | (2018.01) |
| *G01R 31/367* | (2019.01) |
| *G07C 5/00* | (2006.01) |
| *G01R 31/387* | (2019.01) |
| *H04L 29/08* | (2006.01) |
| *H04W 4/44* | (2018.01) |

(52) U.S. Cl.
CPC ........... *G06F 8/658* (2018.02); *G01R 31/367* (2019.01); *G01R 31/387* (2019.01); *G07C 5/008* (2013.01); *H04L 67/12* (2013.01); *H04L 67/34* (2013.01); *H04W 4/44* (2018.02)

(58) Field of Classification Search
CPC ........................................................ G06F 9/44
See application file for complete search history.

(56) References Cited

U.S. PATENT DOCUMENTS

| | | | |
|---|---|---|---|
| 9,575,743 B1* | 2/2017 | Chun | F02N 11/0862 |
| 2013/0132939 A1* | 5/2013 | Murata | H02J 7/04 |
| | | | 717/173 |
| 2014/0109075 A1* | 4/2014 | Hoffman | G06F 11/1464 |
| | | | 717/169 |

* cited by examiner

*Primary Examiner* — Jae U Jeon
(74) *Attorney, Agent, or Firm* — McDonnell Boehnen Hulbert & Berghoff LLP (57) ABSTRACT

A vehicle terminal and a software update method thereof are provided. The vehicle terminal includes a communication device that performs wireless communication with a connected car service (CCS) server and a content delivery network (CDN) server, a storage storing software previously installed in a vehicle, and a processing device that updates the previously installed software based on differential software with regard to an update time and an amount of battery consumption according to a size of the differential software provided from the CDN server.

20 Claims, 4 Drawing Sheets

VEHICLE TERMINAL AND SOFTWARE UPDATE METHOD THEREOF

CROSS-REFERENCE TO RELATED APPLICATION

This application is claims the benefit of priority to Korean Patent Application No. 10-2019-0161989, filed in the Korean Intellectual Property Office on Dec. 6, 2019, the entire contents of which are incorporated herein by reference.

TECHNICAL FIELD

The present disclosure relates to a vehicle terminal and a software update method thereof.

BACKGROUND

A vehicle-based wireless update proceeds for software installed in a vehicle using a battery power source in a state where the vehicle is turned off for customer convenience. Because of a battery discharge problem upon a software update, a state of the battery is checked when the vehicle is turned off to query a customer whether to perform an update. As a vehicle ages, because the amount of charge of the battery continues being lowered, there may occur a situation where a software update does not proceed because battery capacity does not satisfy a predetermined level after a specific time point.

SUMMARY

The present disclosure has been made to solve the above-mentioned problems occurring in the prior art while advantages achieved by the prior art are maintained intact.

An aspect of the present disclosure provides a vehicle terminal for updating vehicle software with regard to an update time and the amount of battery consumption according to a size of differential software, and a parking pattern and a software update method therefor.

The technical problems to be solved by the present inventive concept are not limited to the aforementioned problems, and any other technical problems not mentioned herein will be clearly understood from the following description by those skilled in the art to which the present disclosure pertains.

According to an aspect of the present disclosure, a vehicle terminal may include a communication device that performs wireless communication with a connected car service (CCS) server and a content delivery network (CDN) server, a storage storing software previously installed in a vehicle, and a processing device that updates the previously installed software based on differential software with regard to an update time and an amount of battery consumption according to a size of the differential software provided from the CDN server.

The processing device may proceed with updating the software, when the update time is less than a reference time and when a remaining state of charge (SOC) obtained by subtracting the amount of battery consumption from a current SOC of an auxiliary battery loaded into the vehicle is greater than a minimum SOC.

The processing device may determine whether the differential software is registered with the CDN server through the CCS server, when the vehicle is turned on.

The processing device may request a battery controller to charge an auxiliary battery loaded into the vehicle, when the differential software is registered with the CDN server.

The processing device may access the CDN server using download uniform resource locator (URL) information of the differential software, the download URL information being provided from the CCS server, and may download the differential software.

The processing device may transmit parking information including a parking location and a parking time to the CCS server, when the vehicle is turned off in a state where the differential software is downloaded.

The processing device may transmit destination information and signal strength of the communication device to the CCS server, when the vehicle is turned off in a state where the differential software is not downloaded.

The processing device may transmit the destination information and a parking time to the CCS server, when the vehicle is turned on.

The processing device may transmit a size of the differential software, a time taken to update the software, and a reduced amount of an SOC of an auxiliary battery loaded into the vehicle to the CCS server, when the update of the software is completed.

The processing device may stop the ongoing update of the software and may roll back to the previously installed software, when there is a request not to process with updating the software from a user terminal.

According to another aspect of the present disclosure, a software update method of a vehicle terminal may include requesting, by a vehicle terminal, a CCS server to identify an update of software previously installed in a vehicle, downloading, by the vehicle terminal, differential software for the update of the previously installed software, and updating, by the vehicle terminal, the previously installed software based on the differential software with regard to an update time and an amount of battery consumption according to a size of the differential software.

The requesting the CCS server to identify the update may include determining, by the CCS server, whether the differential software is registered with a CDN server depending on the request of the vehicle terminal.

The requesting the CCS server to identify the update further may include transmitting, by the vehicle terminal, destination information and signal strength to the CCS server, when the vehicle is turned off, and transmitting, by the vehicle terminal, the destination information and a parking time to the CCS server, when the vehicle is turned on.

The requesting the CCS server to identify the update further may include transmitting, by the CCS server, download URL information of the differential software to the vehicle terminal, when it is determined that the differential software is registered with the CDN server.

The downloading of the differential software may include accessing, by the vehicle terminal, the CDN server using the download URL information of the differential software and downloading, by the vehicle terminal, the differential software.

The downloading of the differential software further may include requesting, by the vehicle terminal, a battery controller to charge an auxiliary battery loaded into the vehicle.

The updating of the previously installed software based on the differential software may include transmitting, by the vehicle terminal, parking information including a parking location and a parking time to the CCS server, when the vehicle is turned off, receiving, by the vehicle terminal, an update time and an amount of battery consumption according to a size of the differential software from the CCS server, determining, by the vehicle terminal, whether the update time is less than a reference time, completing, by the vehicle terminal, the update with regard to the update time and the amount of battery consumption and determining whether a remaining SOC of an auxiliary battery loaded into the vehicle is greater than a minimum SOC, when the update time is less than the reference time, and proceeding with updating the previously installed software using the differential software, when the remaining SOC of the auxiliary battery is greater than the minimum SOC after the update is completed.

The proceeding with updating the previously installed software may include comparing the differential software with the previously installed software and installing only a portion with a difference between the differential software and the previously installed software.

The method may further include transmitting, by the vehicle terminal, an update progress situation of the previously installed software to the CCS server and transmitting, by the CCS server, a push notification of the update progress situation to a user terminal matched to the vehicle.

The method may further include stopping, by the vehicle terminal, the ongoing update of the software and rolling backs to the previously installed software, when there is a request not to process with updating the software from a user terminal.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiment of the present disclosure, a detailed description of well-known features or functions will be ruled out in order not to unnecessarily obscure the gist of the present disclosure.

In describing the components of the embodiment according to the present disclosure, terms such as first, second, "A", "B", (a), (b), and the like may be used. These terms are merely intended to distinguish one component from another component, and the terms do not limit the nature, sequence or order of the constituent components. Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Figure 1:
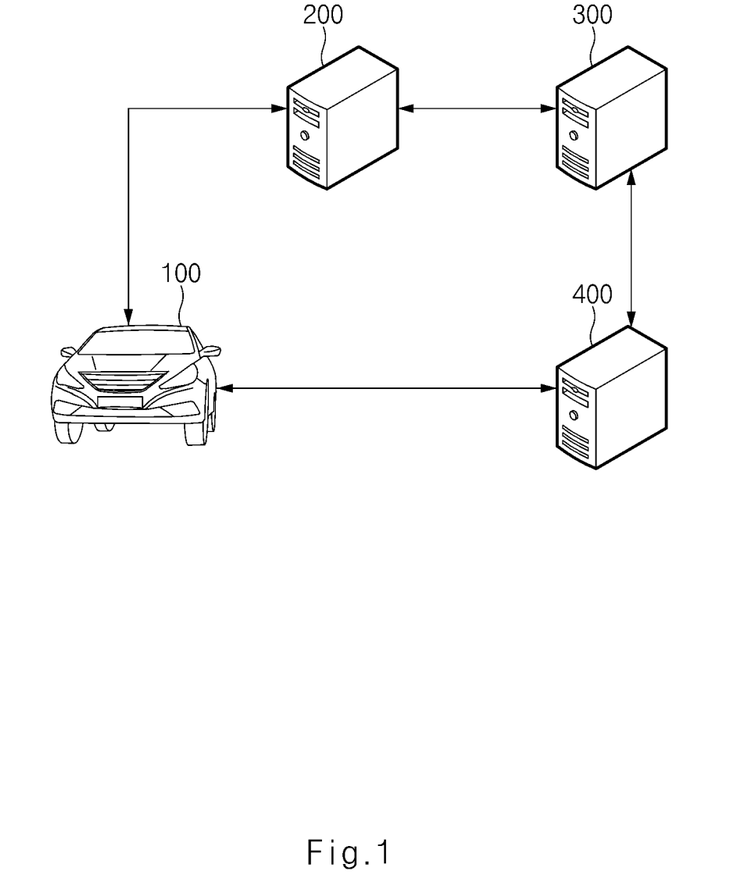
FIG. 1 is a drawing illustrating a configuration of a system for supporting a vehicle software update according to an embodiment of the present disclosure.

FIG. 1 is a drawing illustrating a configuration of a system for supporting a vehicle software update according to an embodiment of the present disclosure.

Referring to FIG. 1, the system for supporting the vehicle software update may include a vehicle 100, a connected car service (CCS) server 200, an on-the-air (OTA) server 300, and a content delivery network (CDN) server 400. Herein, the CCS server 200, the OTA server 300, and the CDN server 400 may be connected over a wired communication network such as a local area network (LAN), a wide area network (WAN), Ethernet, and/or an integrated services digital network (ISDN).

When the vehicle 100 is turned on (e.g., starting the engine), it may determine whether differential software (i.e., software for update) is registered with the CDN server 400, through the CCS server 200 and the OTA server 300. The CCS server 200 may be located in a telematics system (TMS) center for each area to request the OTA server 300 to determine whether differential software is registered, depending on a request of the vehicle 100. The OTA server 300 may determine whether the differential software is registered with the CDN server 400, depending on the request of the CCS server 200. When it is determined that the differential software is registered, the OTA server 300 may receive differential software download uniform resource locator (URL) information from the CDN server 400 and may delivery (transmit) the received differential software download URL information to the CCS server 200. The CDN server 400 may store the differential software. When registering the differential software, the CDN server 400 may transmit a notification that the differential software is registered to the OTA server 300. The CCS server 200 may transmit the differential software download URL information, provided from the OTA server 300, to the vehicle 200. The vehicle 100 may access the CDN server 400 using the transmitted differential software download URL information and may download the differential software.

Figure 2:
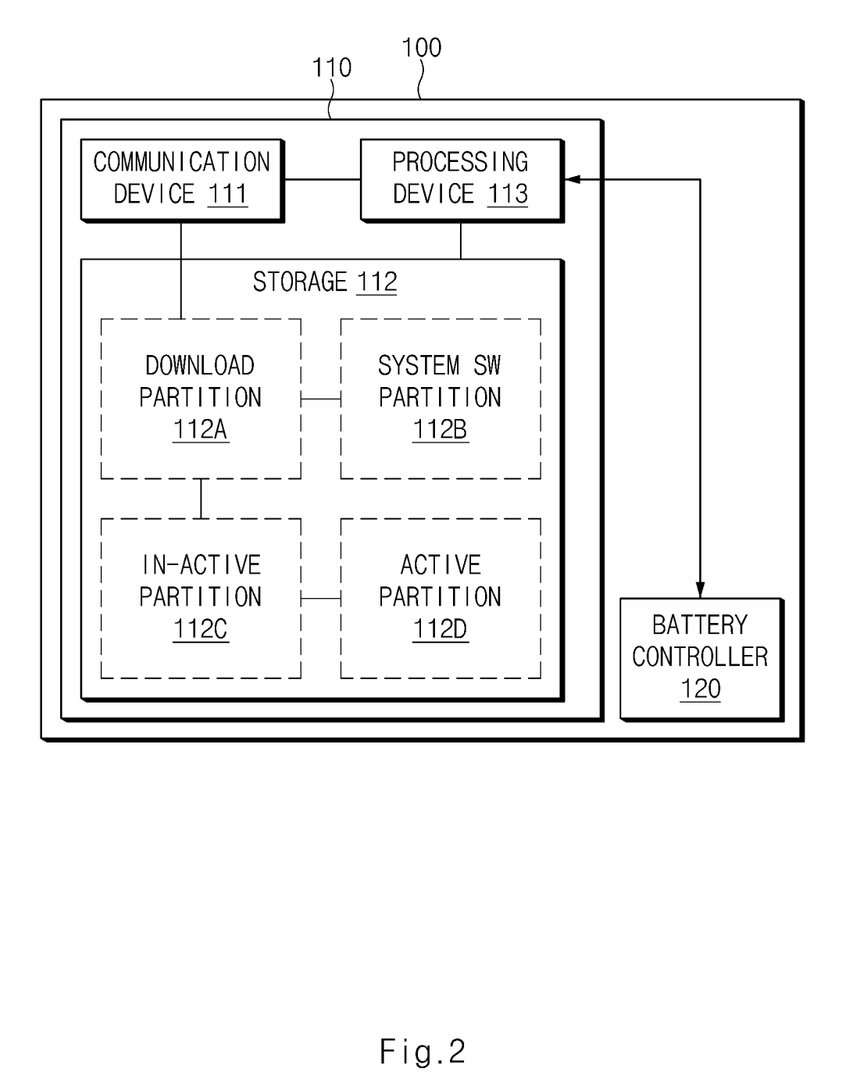
FIG. 2 is a block diagram illustrating a vehicle according to an embodiment of the present disclosure.

FIG. 2 is a block diagram illustrating a vehicle according to an embodiment of the present disclosure.

Referring to FIG. 2, a vehicle 100 may include a vehicle terminal 110 and a battery controller 120.

The vehicle terminal 110 may be a head unit (H/U) loaded into the vehicle 100, which may include a communication device 111, a storage 112, and a processing device 113.

The communication device 111 may transmit and receive data (information) with a CCS server 220 and/or a CDN server 400 of FIG. 1 through wireless communication. A wireless local area network (WLAN) (wireless-fidelity (Wi-Fi)), wireless broadband (Wibro), long term evolution (LTE), international mobile telecommunication (IMT)-2020, Bluetooth, near field communication (NFC), and/or the like may be used as wireless communication technology.

The communication device 111 may include an access point (AP) for playing a role as a bridge between an in-vehicle network (IVN) and wireless communication network and a modem capable of accessing the wireless communication network. The IVN may be implemented as a controller area network (CAN), a media oriented systems transport (MOST) network, a local interconnect network (LIN), Ethernet, X-by-Wire (Flexray), and/or the like.

The storage 112 may be an internal memory, which is implemented as an embedded MultiMediaCard (eMMC). The storage 112 may store system software, application software (e.g., navigation map software or the like), firmware, and the like. The storage 112 may include a download partition 112A for storing software received (downloaded) via the communication device 111, a system software (SW) partition 112B for storing system software programmed to perform a predetermined operation, an in-active partition 112C for storing software not being executed, and an active partition 112D for storing software being currently executed.

The processing device 113 may control an overall operation of the vehicle terminal 110, which may be implemented as at least one of an application specific integrated circuit (ASIC), a digital signal processor (DSP), programmable logic devices (PLD), field programmable gate arrays (FPGAs), a central processing unit (CPU), microcontrollers, and/or microprocessors. The processing device 113 may be manufactured as, that is, a package integrated with the eMMC. Furthermore, the processing device 113 may include a random access memory (RAM), a static RAM (SRAM), a read only memory (ROM), a programmable ROM (PROM), an electrically erasable PROM (EEPROM), an erasable and programmable ROM (EPROM), a register, and/or the like.

When the vehicle 100 is turned off or on, the processing device 113 may transmit vehicle information to the CCS sever 200 via the communication device 111. When the vehicle 100 is turned off (e.g., stop the engine), the processing device 113 may obtain destination information (i.e., a vehicle location) via a global positioning system (GPS) receiver (not shown) and may obtain signal strength information via the communication device 111. The processing device 113 may transmit vehicle information including a vehicle identification number (VIN), destination information, and signal strength information to the CCS server 200. When transmitting the vehicle information in the state where the vehicle 100 is turned off, the processing device 113 may transmit OTA related information, including a size (capacity) of differential software, a time (i.e., an update time) taken to update software using the differential software, and the amount of battery consumption, consumed by updating the software using the differential software, to the CCS server 200. Herein, the amount of battery consumption may refer to the reduced amount of a state of charge (SOC) of an auxiliary battery. For example, the processing 113 may transmit a differential software size of 1.7 GB, an update time of about 1 hour, and the reduced amount of the SOC of the auxiliary battery of about 10% as the OTA related information. Furthermore, when the vehicle 100 is turned on, the processing device 113 may generate and transmit vehicle information including a VIN, destination information (e.g., a vehicle location or a parking location), and parking information to the CCS server 200. The parking information may include a parking location and a parking time (including a stop time).

The processing device 113 may determine whether there is an update on software installed in the vehicle 100, that is, vehicle software, through a TMS center for each area. In detail, the processing device 113 may request the CCS server 200 to identify a software update. When requesting the CCS server 200 to identify the software update, the processing device 113 may transmit version information of the vehicle software installed in the vehicle 100 to the CCS server 200 together. The CCS server 200 may determine whether differential software matched with the vehicle software is registered with the CDN server, through an OTA server 300 of FIG. 1, and may transmit the determined result to the vehicle 100. In other words, the CCS server 200 may compare the version information of the vehicle software with the version information of the differential software uploaded to the CDN server 400. When the version information of the vehicle software is lower than the version information of the differential software, the CCS server 200 may determine that the differential software is registered. When it is determined that the differential software is registered, the CCS server 200 may transmit information indicating that 'there is a software update'. It is determined that the differential software is not registered, the CCS server 200 may transmit information indicating that 'there is no software update'.

The processing device 113 may receive the result of determining the software update, transmitted from the CCS server 200. When it is determined that there is the software update, the processing device 113 may request the battery controller 120 to charge an auxiliary battery. Furthermore, the processing device 113 may request the software update from the CDN server 400 using differential software download URL information included in the result of determining the software update.

The processing device 113 may download the differential software transmitted from the CDN server 400. The processing device 113 may store the downloaded differential software in the download partition 112A of the storage 112. When the download of the differential software is completed, the processing device 113 may monitor an SOC of the auxiliary battery through the battery controller 120. The processing device 113 may identify a current SOC of the auxiliary battery through the monitoring of the SOC of the auxiliary battery. Furthermore, the processing device 113 may store the current SOC of the auxiliary battery, identified when the vehicle 100 is turned off, in the storage 112.

Thereafter, when the vehicle 100 is turned off, the processing device 113 may transmit parking information including a parking location and a parking time to the CCS server 200. The CCS server 200 may collect an update time (including a differential software download time) according to a size of the differential software and a reduced amount of an SOC of the auxiliary battery loaded into the vehicle 100 from respective vehicles to manage statistics for an update time for each differential software size and a reduced amount of an SOC of the auxiliary battery. When receiving the parking information from the vehicle 100, the CCS server 200 may determine whether there is a history where the vehicle 100 parks at the parking location over a reference time (e.g., four hours) based on the received parking information. In other words, when the vehicle 100 is turned off in the state where the download of the differential software is completed, the processing device 113 of the vehicle terminal 110 may transmit the parking information to the CCS server 200, and the CCS server 200 may determine whether the vehicle 100 meets a software update entrance condition, based on the parking information. In other words, the CCS server 200 may determine whether it is possible for the vehicle 100 to execute a wireless software update.

When receiving the update time according to the size of the differential software and the reduced amount of the SOC of the auxiliary battery from the CCS server 200, the processing device 113 may determine whether the update time according to the size of the differential software is less than a predetermined reference time (e.g., four hours). When the update time according to the size of the differential software is less than the reference time, the processing device 113 may determine whether a value (a current SOC of the auxiliary battery—the amount of battery consumption) obtained by subtracting consumption (i.e., the reduced amount of an SOC) of the auxiliary battery, consumed upon the update, from the current SOC of the auxiliary battery is greater than a minimum SOC. In other words, after completing the vehicle software update using the differential software based on the update time according to the size of the differential software and the amount of battery consumption, provided from the CCS server 200, the processing device 113 may determine whether a remaining SOC of the auxiliary battery is greater than the minimum SOC. Herein, the minimum SOC may be the minimum SOC which does not affects the vehicle 100, which is determined by the vehicle terminal 110.

When the remaining SOC of the auxiliary battery is greater than the minimum SOC after the vehicle software update is completed, the processing device 113 may proceed with an update. When proceeding with the software update, the processing device 113 may copy the vehicle software being executed, from the active partition 112D to the in-active partition 112C. The processing device 113 may compare the vehicle software copied to the in-active partition 112C with the differential software downloaded to the download partition 112A to install only a portion with a difference between the vehicle software and the differential software (only a portion necessary to be installed) in the in-active partition 112C. Furthermore, the processing device 113 may compare system software stored in the system SW partition 112B with the differential software to install only a portion with a difference between the system software and the differential software in the system SW partition 112B.

When the update time according to the size of the differential software is greater than or equal to the reference time (e.g., four hours), when the remaining SOC of the auxiliary battery obtained by subtracting the amount of battery consumption (the reduced amount of the SOC of the auxiliary battery) upon the update from the current SOC of the auxiliary battery is less than or equal to the minimum SOC, or when the software update is completed, the processing device 113 may switch an operation mode of the vehicle terminal 110 to a sleep mode.

Upon proceeding with the update, the processing device 113 may transmit a notification of an update progress situation (e.g., an update start time, a location, or the like) to the CCS server 200. Furthermore, when the update is completed, the processing device 113 may transmit a notification of the update completion situation to the CCS server 200. The update completion situation may include an update start time, an update completion time, an update location, a reduced amount of an SOC of the auxiliary battery according to a size of the differential software, and the like. The CCS server 200 may transmit the update progress situation and/or the update completion situation to a user terminal (e.g., a smartphone) matched to the vehicle 100. The user terminal (not shown) may output an update progress state as a push notification to notify a user of the update progress state. The CCS server 200 may notify the user of an expected time when the update is completed together when notifying the user of the update progress situation.

The battery controller 120 may charge the auxiliary battery (a 12-V battery) loaded into the vehicle 100 depending on the request of the vehicle terminal 110. The battery controller 120 may supply a power of the auxiliary battery as an operating power of 12-V electric power loads. Such a battery controller 120 may be implemented as a low voltage DC-DC converter (LDC). The battery controller 120 may detect and deliver (provide) a current SOC of the auxiliary battery depending on the request of the vehicle terminal 110.

Figure 3:
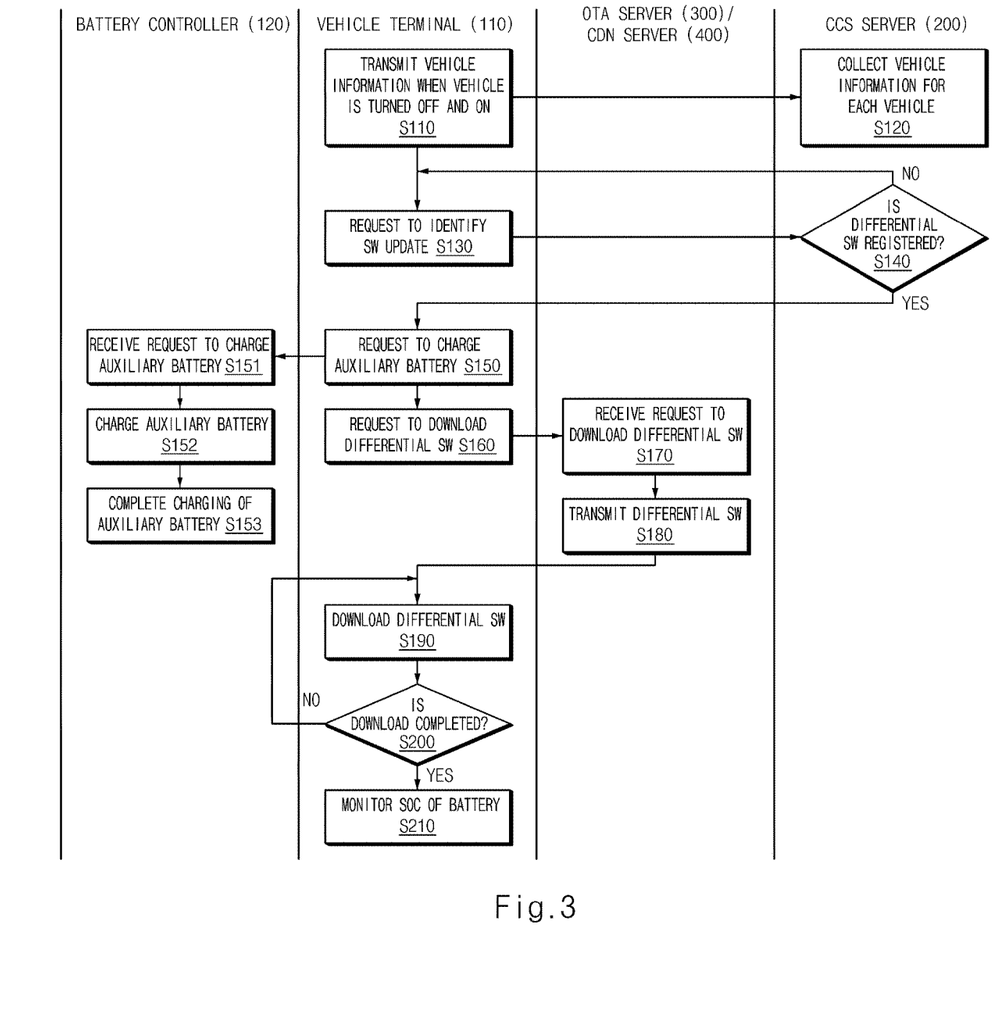
FIGS. 3 and 4 are signal sequence diagrams illustrating a software update method of a vehicle terminal according to an embodiment of the present disclosure.
Figure 4:
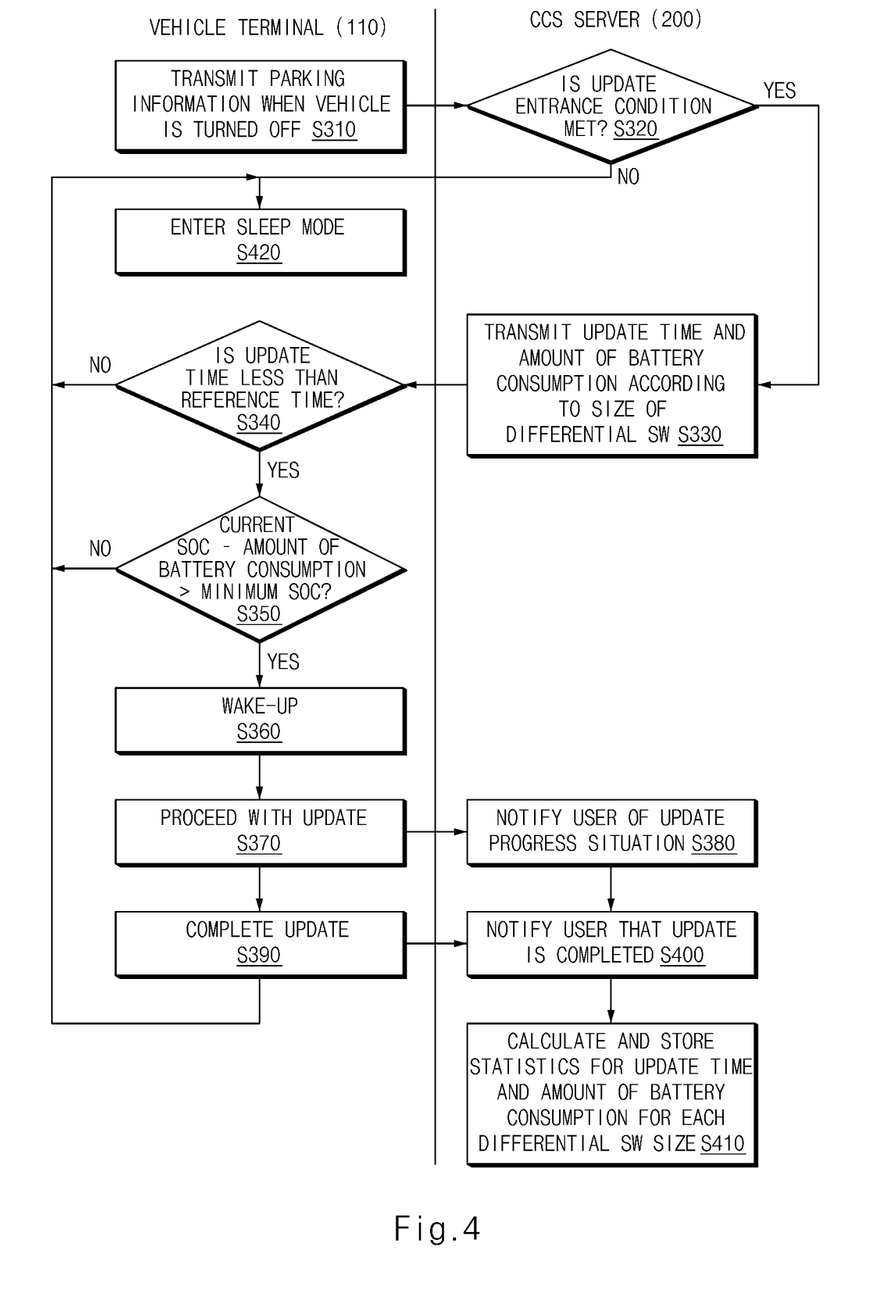

FIGS. 3 and 4 are signal sequence diagrams illustrating a software update method of a vehicle terminal according to an embodiment of the present disclosure.

In S110, when a vehicle 100 of FIG. 1 is turned off and on, a vehicle terminal 110 may transmit vehicle information to a CCS server 200. When the vehicle 100 is turned off, the vehicle terminal 110 may transmit vehicle information including a vehicle identification number (VIN), destination information, signal strength, and the like. When the vehicle 100 is turned on, the vehicle terminal 110 may transmit vehicle information including a VIN, destination information, a parking time (including a stop time), and the like.

In S120, the CCS server 200 may collect vehicle information transmitted from the vehicle terminal 110 loaded into the vehicle 100. The CCS server 200 may calculate and manage statistics based on the vehicle information collected for each vehicle. For example, the CCS server 200 may calculate and manage a history of parking at a specific destination over four hours in the last week.

In S130, the vehicle terminal 110 may transmit a request to identify a software (SW) update to the CCS server 200 to determine whether there is an update on vehicle SW installed in the vehicle terminal 110 in a state where the vehicle 100 is turned on. When requesting to identify the SW update, the vehicle terminal 110 may transmit version information of the vehicle SW installed in the vehicle terminal 100 together.

When receiving the request to identify the SW update from the vehicle 100, in S140, the CCS server 200 may determine whether differential SW for the vehicle SW installed in the vehicle 100 is registered with a CDN server 400 through an OTA server 300. In other words, the CCS server 200 may determine whether SW of a version upper than version information of the SW installed in the vehicle 100 is registered. The CCS server 200 may transmit the result of identifying the SW update to the vehicle terminal 110.

When the differential SW is registered as a result of identifying the SW update, in S150, the vehicle terminal 110 may request a battery controller 120 to charge an auxiliary battery. When receiving the request to charge the auxiliary battery in S151, in S152, the battery controller 120 may charge the auxiliary battery. In S153, the battery controller 120 may proceed with charging the auxiliary battery until the charging of the auxiliary battery is completed.

In S160, the vehicle terminal 110 may proceed with charging the auxiliary battery and may request the CDN server 400 to download the differential SW. The vehicle terminal 110 may request the CDN server 400 to download the differential SW using download URL information of the differential SW, provided from the CCS server 200.

When receiving the request to download the differential SW from the vehicle terminal 110 in S170, in S180, the CDN server 400 may transmit the differential SW to the vehicle terminal 110 based on the download URL information of the differential SW.

In S190, the vehicle terminal 110 may download the differential SW transmitted from the CDN server 400. The vehicle terminal 110 may store the downloaded differential SW in a download partition 112A of the storage 112.

In S200, the vehicle terminal 110 may determine whether the download of the differential SW is completed. When the download of the differential SW is completed, in S210, the vehicle terminal 110 may monitor an SOC of the auxiliary battery through the battery controller 120.

Thereafter, referring to FIG. 4, in S310, when the vehicle 100 is turned off, the vehicle terminal 110 may transmit parking information to the CCS server 200. The parking information may include a parking location (destination information) and a parking time (including a stop time).

In S320, the CCS server 200 may determine whether an update entrance condition is met based on the parking information transmitted from the vehicle terminal 110. The CCS server 200 may determine whether there is a history where the vehicle 100 parks over a reference time at a parking location included in the parking information during a predetermined time period. When there is the history, the CCS server 200 may determine whether the update entrance condition is met. For example, according to the parking information transmitted from the vehicle terminal 110, when a location where the vehicle 100 parks is my house and when a time when the vehicle 100 parks at the parking location is 23:00, the CCS server 200 may determine that the update entrance condition is met when a time when the vehicle 100 averagely parks at my house which is a destination in the last week is over four hours, which are from 20:00 to next day 6:00.

When the update entrance condition is met, in S330, the CCS server 200 may transmit an update time and the amount of battery consumption (the reduced amount of an SOC of the auxiliary battery) according to a size of differential SW to the vehicle terminal 110. The amount of battery consumption may refer to capacity of the auxiliary battery consumed to update the vehicle SW using the differential SW, that is, the reduced amount of the SOC of the auxiliary battery.

In S340, the vehicle terminal 110 may determine whether the update time according to the size of the differential SW is less than a reference time (e.g., four hours). The vehicle terminal 110 may determine whether a time taken to perform a software SW according to the size of the differential SW, which is statistically calculated by the CCS server 200, is less than the reference time.

In S350, the vehicle terminal 110 may determine whether 'the current SOC of the auxiliary battery—the amount of battery consumption' is greater than a minimum SOC. In other words, after completing a vehicle software update using the differential SW based on the update time and the amount of battery consumption according to the size of the differential SW, which are provided from the CCS server 200, the vehicle terminal 110 may determine whether a remaining SOC of the auxiliary battery is greater than the minimum SOC. Herein, the minimum SOC may be the minimum SOC of the auxiliary battery, which does not affect the vehicle 100, which is determined by the vehicle terminal 110.

When a difference between the current SOC of the auxiliary battery and the reduced amount of the SOC upon the update is greater than the minimum SOC, in S360, the vehicle terminal 110 may switch an operation mode of the vehicle terminal 110 to a wake-up mode.

In S370, the vehicle terminal 110 may proceed with an SW update using the downloaded differential SW. The vehicle terminal 110 may copy application SW stored in an active partition 112D of FIG. 2 to an in-active partition 112C of FIG. 2 and may compare the application SW with differential SW stored in a download partition 112A of FIG. 2 to install only a portion with a difference between the application SW and the differential SW in the in-active partition 112C. Furthermore, the vehicle terminal 110 may compare the differential SW stored in the download partition 112A with system SW stored in a system SW partition 112B of FIG. 2 to install only a portion with a difference between the differential SW and the system SW in the system SW partition 112B.

In S380, the vehicle terminal 110 may transmit a software update progress situation to the CCS server 200 and may notify a user matched to the vehicle 100 of the update progress situation. In other words, the CCS server 200 may transmit a push notification of the software update progress situation to a user terminal matched to the vehicle 100 such that the user may identify the software update progress situation.

In S390, the vehicle terminal 110 may complete the SW update based on the differential SW. The vehicle terminal 110 may transmit information indicating that the SW update is completed to the CCS server 200. Furthermore, the vehicle terminal 110 may transmit the size of the differential SW, the time taken to update the differential SW, and the amount of battery consumption used to update the differential SW to the CCS server 200.

In S400, the CCS server 200 may notify the user that the update is completed. The CCS server 200 may transmit a push notification that the SW update is completed to the user terminal matched to the vehicle 100.

In S410, the CCS server 200 may calculate statistics for the update time and the amount of battery consumption according to the size of the differential SW based on the information collected for each vehicle (e.g., the size of the differential SW, the time taken to update the differential SW, and the amount of battery consumption used to update the differential SW).

When the SW update is completed, in S420, the vehicle terminal 110 may enter a sleep mode. In other words, the vehicle terminal 110 may switch the operation mode of the vehicle terminal 110 from a wakeup mode to the sleep mode.

Meanwhile, when receiving a request not to proceed with the update, transmitted from the user terminal via the CCS server 200, the vehicle terminal 110 may stop the ongoing SW update or may cancel the SW update to roll back to a previously installed SW.

According to embodiments of the present disclosure, the vehicle terminal may calculate an update time according to a size of differential software and the amount of battery consumption and may variably change a software update entrance time point, thus enhancing a probability of proceeding with an update.

Furthermore, according to embodiments of the present disclosure, the vehicle terminal may analyze a parking pattern of the user and may automatically proceed with updating software in a time when the vehicle is not used, thus increasing user convenience.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

Therefore, the exemplary embodiments of the present disclosure are provided to explain the spirit and scope of the present disclosure, but not to limit them, so that the spirit and scope of the present disclosure is not limited by the embodiments. The scope of the present disclosure should be construed on the basis of the accompanying claims, and all the technical ideas within the scope equivalent to the claims should be included in the scope of the present disclosure.

What is claimed is:
1. A vehicle terminal, comprising:
  a communication device configured to perform wireless communication with a connected car service (CCS) server and a content delivery network (CDN) server;
  a storage storing software previously installed in a vehicle; and a processing device configured to update the previously installed software based on differential software with regard to an update time and an amount of battery consumption according to a size of the differential software provided from the CDN server.

2. The vehicle terminal of claim 1, wherein the processing device proceeds with updating the software, when the update time is less than a reference time and when a remaining state of charge (SOC) obtained by subtracting the amount of battery consumption from a current SOC of an auxiliary battery loaded into the vehicle is greater than a minimum SOC.

3. The vehicle terminal of claim 1, wherein the processing device determines whether the differential software is registered with the CDN server through the CCS server, when the vehicle is turned on.

4. The vehicle terminal of claim 1, wherein the processing device requests a battery controller to charge an auxiliary battery loaded into the vehicle, when the differential software is registered with the CDN server.

5. The vehicle terminal of claim 4, wherein the processing device accesses the CDN server using download uniform resource locator (URL) information of the differential software, the download URL information being provided from the CCS server, and downloads the differential software.

6. The vehicle terminal of claim 1, wherein the processing device transmits parking information including a parking location and a parking time to the CCS server, when the vehicle is turned off in a state where the differential software is downloaded.

7. The vehicle terminal of claim 1, wherein the processing device transmits destination information and signal strength of the communication device to the CCS server, when the vehicle is turned off in a state where the differential software is not downloaded.

8. The vehicle terminal of claim 7, wherein the processing device transmits the destination information and a parking time to the CCS server, when the vehicle is turned on.

9. The vehicle terminal of claim 1, wherein the processing device transmits a size of the differential software, a time taken to update the software, and a reduced amount of an SOC of an auxiliary battery loaded into the vehicle to the CCS server, when the update of the software is completed.

10. The vehicle terminal of claim 1, wherein the processing device stops the ongoing update of the software and rolls back to the previously installed software, when there is a request not to process with updating the software from a user terminal.

11. A software update method of a vehicle terminal, the method comprising:
    requesting, by a vehicle terminal, a CCS server to identify an update of software previously installed in a vehicle;
    downloading, by the vehicle terminal, differential software for the update of the previously installed software; and
    updating, by the vehicle terminal, the previously installed software based on the differential software with regard to an update time and an amount of battery consumption according to a size of the differential software.

12. The method of claim 11, wherein the requesting the CCS server to identify the update includes:
    determining, by the CCS server, whether the differential software is registered with a CDN server depending on the request of the vehicle terminal.

13. The method of claim 12, wherein the requesting the CCS server to identify the update further includes:
    transmitting, by the vehicle terminal, destination information and signal strength to the CCS server, when the vehicle is turned off; and
    transmitting, by the vehicle terminal, the destination information and a parking time to the CCS server, when the vehicle is turned on.

14. The method of claim 12, wherein the requesting the CCS server to identify the update further includes:
    transmitting, by the CCS server, download URL information of the differential software to the vehicle terminal, when it is determined that the differential software is registered with the CDN server.

15. The method of claim 14, wherein the downloading of the differential software includes:
    accessing, by the vehicle terminal, the CDN server using the download URL information of the differential software and downloading, by the vehicle terminal, the differential software.

16. The method of claim 15, wherein the downloading of the differential software further includes:
    requesting, by the vehicle terminal, a battery controller to charge an auxiliary battery loaded into the vehicle.

17. The method of claim 11, wherein the updating of the previously installed software based on the differential software includes:
    transmitting, by the vehicle terminal, parking information including a parking location and a parking time to the CCS server, when the vehicle is turned off;
    receiving, by the vehicle terminal, an update time and an amount of battery consumption according to a size of the differential software from the CCS server;
    determining, by the vehicle terminal, whether the update time is less than a reference time;
    completing, by the vehicle terminal, the update with regard to the update time and the amount of battery consumption and determining whether a remaining SOC of an auxiliary battery loaded into the vehicle is greater than a minimum SOC, when the update time is less than the reference time; and
    proceeding with updating the previously installed software using the differential software, when the remaining SOC of the auxiliary battery is greater than the minimum SOC after the update is completed.

18. The method of claim 17, wherein the proceeding with updating the previously installed software includes:
    comparing the differential software with the previously installed software; and
    installing only a portion with a difference between the differential software and the previously installed software.

19. The method of claim 11, further comprising:
    transmitting, by the vehicle terminal, an update progress situation of the previously installed software to the CCS server; and
    transmitting, by the CCS server, a push notification of the update progress situation to a user terminal matched to the vehicle.

20. The method of claim 19, further comprising:
    stopping, by the vehicle terminal, the ongoing update of the software and rolling backs to the previously installed software, when there is a request not to process with updating the software from a user terminal.

* * * * *